United States Patent [19]

Fletcher

[11] Patent Number: 4,667,337
[45] Date of Patent: May 19, 1987

[54] INTEGRATED CIRCUIT HAVING OUTPUTS CONFIGURED FOR REDUCED STATE CHANGES

[75] Inventor: Roderick J. Fletcher, Glen Burnie, Md.

[73] Assignee: Westinghouse Electric Corp., Pittsburgh, Pa.

[21] Appl. No.: 770,131

[22] Filed: Aug. 28, 1985

[51] Int. Cl.$^4$ .................... H03K 19/003; H03K 19/21
[52] U.S. Cl. ........................... 377/41; 364/707; 365/227; 307/443; 307/471
[58] Field of Search .............. 377/41; 307/440, 445, 307/362, 443, 463, 471, 473; 364/707; 365/227; 371/66

[56] References Cited

U.S. PATENT DOCUMENTS

| | | | |
|---|---|---|---|
| 4,027,335 | 5/1977 | Miller | 360/40 |
| 4,103,190 | 7/1978 | Beutler | 307/362 |
| 4,104,735 | 8/1978 | Hofmann et al. | 307/463 |
| 4,139,840 | 2/1979 | Mogi | 377/41 |
| 4,176,287 | 11/1979 | Remedi | 307/463 |
| 4,194,130 | 3/1980 | Muench | 307/463 |
| 4,217,502 | 8/1980 | Suzuki et al. | 307/473 |
| 4,233,667 | 11/1980 | Devine et al. | 364/707 |
| 4,344,005 | 8/1982 | Stewart | 307/463 |
| 4,414,480 | 11/1983 | Zasio | 307/443 |
| 4,455,623 | 6/1984 | Wesemeyer et al. | 364/707 |
| 4,546,456 | 10/1985 | Buie | 365/227 |

OTHER PUBLICATIONS

IBM Tech Disclosure Bul., vol. 25, No. 4, 9/1982, "CMOS Decoder Circuit", by Terman, pp. 2135, 2136.

Primary Examiner—John S. Heyman
Attorney, Agent, or Firm—W. G. Sutcliff

[57] ABSTRACT

A logic arrangement for low power integrated circuits which reduces the number of state changes at the synchronously clocked parallel outputs of the integrated circuit. Logic is included which determines the number of output lines which would normally change state when the next output word is clocked onto the output lines. Additional logic determines whether this number is greater than or equal to a predetermined number, being one-half the number of output lines for even numbers of output lines. When the number of state changes will exceed this number, the output word is complemented before being clocked onto the output lines. An extra output line is used to signal the circuitry connected to the output lines that the output states have been complemented. When the number of state changes equals the predetermined number, the output word is complemented only if the previous output word was complemented.

18 Claims, 1 Drawing Figure

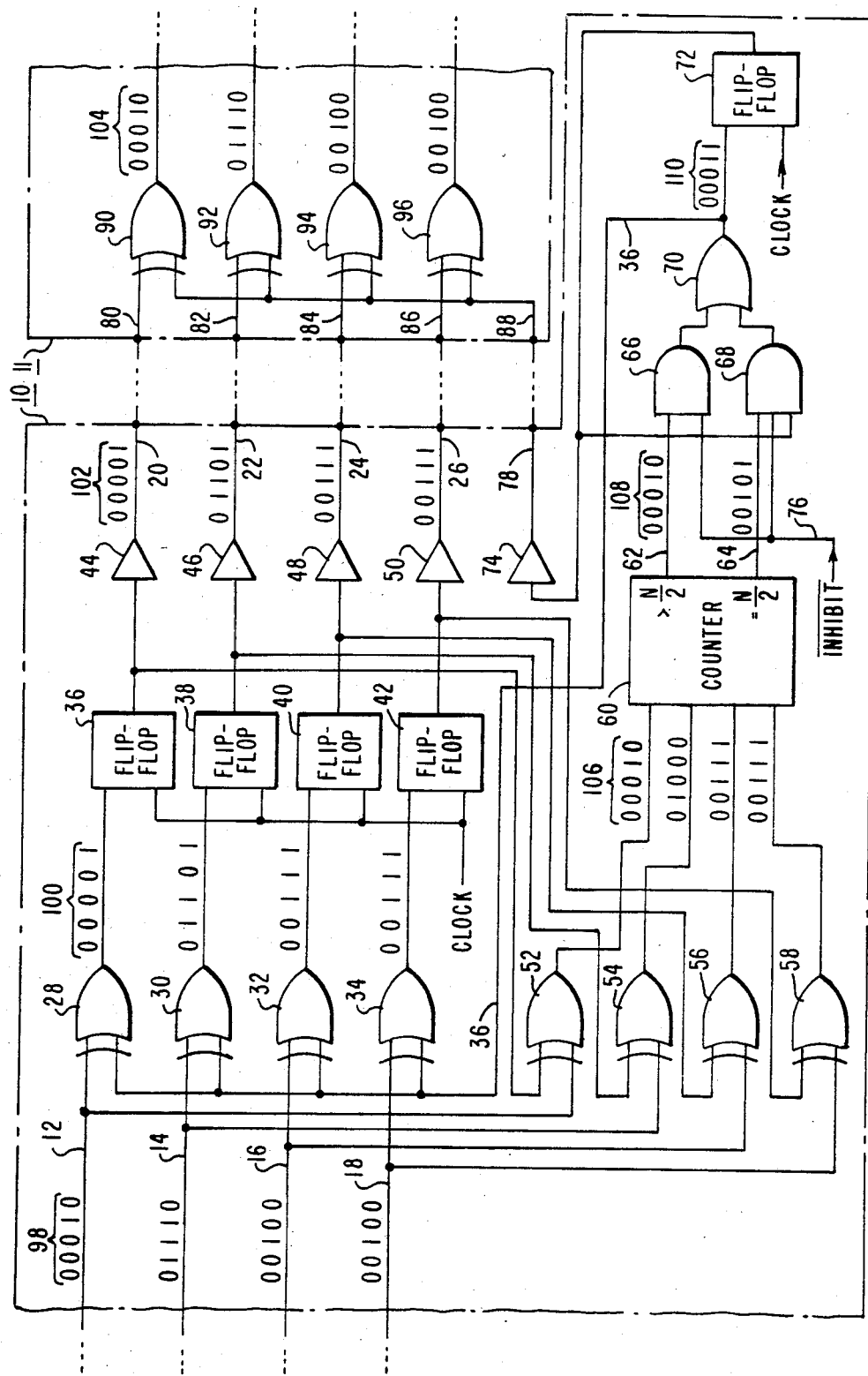

INTEGRATED CIRCUIT HAVING OUTPUTS CONFIGURED FOR REDUCED STATE CHANGES

LICENSE RIGHTS

The U.S. Government has a paid-up license in this invention and the right in limited circumstances to require the patent owner to license others on reasonable terms as provided for by the terms of contract No. F33615-81-C-1532/POOO6 awarded by the U.S. Air Force.

BACKGROUND OF THE INVENTION

This invention relates, in general, to integrated circuits and, more specifically, to output line configurations of very large scale CMOS integrated circuits.

It is advantageous to reduce the power consumption of integrated circuits both for power economy of the circuit into which the integrated circuit will be used, and for efficiency and material tolerances within the chip itself. CMOS integrated circuits are well known to exhibit very little power consumption compared to many conventional integrated circuits. Therefore, they are used in applications where power consumption is of critical importance. Because of this importance, it is beneficial and advantageous to provide CMOS integrated circuits which exhibit the least amount of power consumption possible.

In the present state of the art, the power consumption of the logic gates and transistors comprising the CMOS integrated circuit is very small. A large portion of the total power consumption of a CMOS integrated circuit is caused by state changes, that is, changes between 0 and 1 or 1 and 0, at the output lines of the integrated circuit. This is due mainly to the capacitance of the output lines impeding the change from one state to another. Therefore, the number of output lines of the integrated circuit which change state upon operation of the device significantly contributes to the total power consumption of the device.

Because of the ease of incorporating extra gates and transistors into an integrated circuit chip, power reducing techniques which require extra gates or transistors in an integrated circuit are not necessarily unattractive. Because of this fact, the trade-off between extra gates in the integrated circuit and the reduced power consumption afforded by their use may be justified. The use of additional output lines for the integrated circuit to accomplish reduced power consumption also follows the same rationale.

Therefore, it is desirable, and it is an object of this invention, to reduce the power consumption of a CMOS integrated circuit by using a unique configuration even though it requires additional output lines and logic gates and transistors within the integrated circuit.

SUMMARY OF THE INVENTION

There is disclosed herein a new and useful arrangement of a low power integrated circuit, such as a CMOS integrated circuit (IC). According to this invention, the synchronously clocked parallel output lines of the integrated circuit are modified to include apparatus for complementing the output lines under certain conditions. The apparatus includes logic gates which determine the current, or present, output of the integrated circuit and compares the current output with the logic levels or values which are ready to be clocked onto the output lines of the integrated circuit for the next output.

A counting circuit determines how many of the parallel output lines would change state if the next set of logic values are clocked onto the output lines without complementing. If the counted number is greater than one-half of the number of output lines, the circuit functions to activate complementing gates in the output line circuit so that the logic states to be clocked onto the output will change less than half of the output states. In addition to complementing the states to be clocked onto the output lines, a signal is applied to an additional output line which is used to decode the inputs of the device or devices to which the output lines are connected, so that the complemented states can be converted back to normal.

In the event that clocking the next output states onto the output lines would result in a change in exactly one-half of the number of output line states, the apparatus of this invention complements these next states before clocking if the previous cycle consisted of complementing the output states. Otherwise, the next output states are not complemented before being clocked onto the output lines.

The apparatus includes exclusive OR logic gates connected between the internal output line of the integrated circuit and the external or latched output line available to the pins of the integrated circuit. Because of the properties of the exclusive OR circuits, a high logic level is produced at the outputs of the exclusive OR circuits only when their two inputs are different, thereby indicating that the latched output would change state if the input states are clocked onto the output lines without being complemented. The complementing is achieved by additional exclusive OR circuits contained within the output line path, with one input of each exclusive OR circuit connected to a common complementing control signal originating from a circuit which counts the number of potential state changes which would occur without complementing.

The invention also includes a logic line which can be tied high or low to set the mode of operation of the integrated circuit. That is, when tied at one logic level, the circuit would operate in the conventional manner with no complementing and a conventional number of output lines. When tied to the other logic level, the circuit would function according to the teachings of this invention, and the output would include at least one additional output line for use by the circuits in decoding the regular output lines.

DESCRIPTION OF THE DRAWING

Further advantages and uses of this invention will become more apparent when considered in view of the following detailed description and drawing, in which the drawing is a block diagram illustrating the arrangement and operation of the apparatus of this invention.

DESCRIPTION OF THE PREFERRED EMBODIMENTS

Since the total power dissipated in CMOS integrated circuits is largely attributable to state changes in their output lines, that is, transitions from 0 to 1 or from 1 to 0, reducing the number of state changes is a viable method of decreasng the total power dissipation of the device. The output lines may be address, data, control, or any other type of synchronously clocked parallel output lines which change state at the same time. The number of output lines which are clocked synchronously also determines the ratio by which this invention reduces the number of state changes.

According to this invention, either a word (comprising N bits), or the complement of the word, will be outputted to N output lines, whichever results in fewer state changes. An additional line is used to output a logic level indicative of whether the outputted word was unaltered or was complemented. If exactly half of the bits of the word would change state, then the additional line will remain the same and the word will or will not be complemented accordingly.

To analyze the effectiveness of this arrangement, it will be assumed that all $2^N$ combinations of state changes among the original N outputs are likely to occur on an equal basis. Depending upon the number of original output lines, the advantage of the present invention in reducing the number of output states, even considering the additional output line, can be conveniently tabulated. Table 1, shown below, indicates the improvement provided by the present invention in reducing the number of output state changes for different numbers of original output lines.

of occurrence number, and summing the results. As can be seen, the reduced weighted sum represents a 25% improvement over the original weighted sum.

An analysis of Table 1 for four and eight output lines is similar to the analysis given for two original output lines. The results of the weighted sums indicate that there is a 22% improvement provided by the invention when there are four original output lines, and an 18% improvement when there are eight original output lines. Thus, the greatest percent reduction occurs for the smallest values of original output lines. It should be noted, however, that the smaller values of output lines also produce a larger percentage increase in the total number of output lines since the additional line represents a greater proportion of the total. If the eight original output lines were treated as four separate cases of two output lines, then N=8 achieves the same reduction in state changes for an equivalent increase in pinouts as N=2. That is, for a 50% increase in pin count, a 25% reduction in the number of state changes is achieved. By varying the number of blocks into which a larger word is broken (larger N partitioned into

TABLE 1

| | | | | | | | | | Weighted Sum |
|---|---|---|---|---|---|---|---|---|---|
| N = 2 | | | | | | | | | |
| Original Number of State Changes: | 0 | 1 | 2 | | | | | | |
| Relative Frequency of Occurrence: | 1 | 2 | 1 | | | | | | 4 |
| Reduced Number of State Changes: | 0.5 | 1 | 0.5 | | | | | | 3 |
| N = 4 | | | | | | | | | |
| Original Number of State Changes: | 0 | 1 | 2 | 3 | 4 | | | | |
| Relative Frequency of Occurrence: | 1 | 4 | 6 | 4 | 1 | | | | 32 |
| Reduced Number of State Changes: | 0.5 | 1.5 | 2 | 1.5 | 0.5 | | | | 25 |
| N = 8 | | | | | | | | | |
| Original Number of State Changes: | 0 | 1 | 2 | 3 | 4 | 5 | 6 | 7 | 8 | |
| Relative Frequency of Occurrence: | 1 | 8 | 28 | 56 | 70 | 56 | 28 | 8 | 1 | 1024 |
| Reduced Number of State Changes: | 0.5 | 1.5 | 2.5 | 3.5 | 4 | 3.5 | 2.5 | 1.5 | 0.5 | 837 |

As shown in Table 1 for integrated circuits having two output lines (N=2), there can be three different conditions possible upon clocking in a new output word. None of the output lines will change state; just one of the output lines will change state; or both output lines will change state. Because of statistical probability, a state change in just one of the two output lines will happen twice as often as either a change in both output lines or no changes at all. The weighted sum of the state changes which would occur without complementing according to this invention is calculated by multiplying each state change number by the corresponding frequency of occurrence number, and summing the products. Thus, for an original number of two output lines, and under average conditions, a total of four state changes would occur as a result of all possible state change combinations.

The reduced number of state changes indicated, which would occur according to this invention, includes the extra state change occurring because of the additional output. A change in this output is assumed to occur with 50% probability whenever its value is strictly determined by the other output lines. Whenever the number of state changes in the other output lines are equal regardless of whether they are complemented or not, then the additional line does not change state. This characteristic explains why all but the middle values in the reduced number of state changes category have 0.5 added to them. As shown in Table 1 for two output lines, the weighted sum of the reduced state changes is equal to 3, which is calculated by multiplying the reduced number by the corresponding relative frequency smaller N's), a trade-off may be made between the number of extra lines and the amount of reduction in the number of state changes.

The preceding analysis is based upon the condition that the number of state changes would follow the statistical probabilities. A worst cast analysis would assume that all of the N output lines would be complemented for every change in the output, or clock. It is emphasized that the performance of this invention is even more significant under such worst case conditions than for the average conditions assumed in the preceding analysis.

The worst case condition occurs when just half of the original output lines involve a state change. If more than half of the output lines would involve a state change, then the output word is complemented so that fewer than half the outputs will actually change state. If the extra output itself changes state, then, at most, N/2 state changes can occur assuming that N is even, or (N+1)/2 changes can occur assuming that N is odd. If exactly half of the original output lines involve a state change, then the extra output does not change state. Therefore, at most, N/2 outputs change state for even values of N. Hence, the arrangement disclosed herein achieves a 50% reduction in the worst case number of state changes. This result is especially significant since the dissipation of the CMOS chip must be designed to correspond to worst case conditions. With the use of this invention, such conditions can be reduced by 50%, or by a factor of two.

The invention disclosed herein can be implemented by the circuit shown in the drawing. Referring to the drawing, there is shown a block diagram of a logic system or array which provides the preferred embodiment of the invention. The output lines of integrated circuit 10 are connected to the input lines of the integrated circuit 11. It is emphasized that the input circuit of the integrated circuit 10 may be similar to the input circuit of integrated circuit 11 shown in the drawing. The illustration in the drawing of the input circuit for a separate integrated circuit is done for the purposes of clarity since the outputs of one integrated circuit would often be connected to the inputs of another integrated circuit.

The output circuit of integrated circuit 10 includes the internal output lines 12, 14, 16 and 18 which first receive the logic values, levels, or states for clocking onto the externally available output lines 20, 22, 24, and 26. Each of the internal output lines is connected to an input of an exclusive OR logic gate, such as gates 28, 30, 32 and 34. These exclusive OR gates have their other inputs connected together and to a signal which controls, through line 36, the complementing properties of the exclusive OR circuits. Thus, when line 36 is at a high or 1 logic level, the exclusive OR circuits 28, 30, 32 and 34 provide outputs which are complements of their separate inputs. When line 36 is at a low or 0 logic level, the outputs of the exclusive OR circuits are identical, in logic levels, to their inputs.

The logic signals produced by the exclusive OR circuits 28, 30, 32 and 34 are clocked into the flip-flops 36, 38, 40 and 42, respectively, to latch these logic values or states at their respective levels. The latched outputs from the flip-flops are applied to the output drivers 44, 46, 48 and 50 which are connected to the external output lines of the integrated circuit 10. Thus, the output states which are produced at the outputs of the exclusive OR circuits 28, 30, 32, and 34 are latched onto the external output lines and remain at that state until the next clock cycle.

Exclusive OR circuits 52, 54, 56 and 58 each have a separate input connected to an internal output line and to a point containing or providing the latched output to the external output lines. This type input to the exclusive OR gates make them operate as devices which compare the states arriving on the internal output lines, or bus, of the integrated circuit 10 for clocking onto the external output lines sometime into the future. Thus, it is possible, with the exclusive OR circuits 52, 54, 56 and 58, to determine whether the states to be clocked onto the output lines would change the state of external output line. If a change of state was to occur, the particular exclusive OR circuit would yield, at its output, a high or 1 logic level. By determining the number of high logic levels provided by the exclusive OR circuits, control of the complementing exclusive OR gates can be maintained to achieve the purposes of this invention.

The counter circuit 60 looks at the outputs of the exclusive OR gates 52, 54, 56, and 58 and determines the number of gates which have a high logic output. This corresponds to the number of output lines which would change state if the next output word was clocked onto the output lines without being complemented. The counter 60 includes circuitry for determining whether the number of high levels counted is greater than or equal to the number of output lines divided by two. Whenever the number of high logic values is greater than such number, the counter circuit provides a high logic value to line 62. Whenever the number counted is equal to one-half the number of output lines, a high logic value is provided to line 64. Whenever these two conditions are not met, the outputs to lines 62 and 64 are low or 0 logic levels.

The remainder of the logic circuit for the integrated circuit 10 includes the AND gates 66 and 68, the OR gate 70, the latching flip-flop 72, and the driver or buffer 74. These elements or gates additionally decode the two output lines from the counter 60, the previous logic state of the complementing control line 36, and the current state of the inhibit line 76. As will be described later herein, the decoding determines whether to complement, on the next clock cycle, the output states and to approprately set the level of the additional output line 78.

The four output lines of integrated circuit 10 are shown connected to the four input lines, lines 80, 82, 84 and 86, of the integrated circuit 11. In addition, output line 78 of integrated circuit 10 is connected to input line 88 of integrated circuit 11. These lines are connected, as shown, to exclusive OR gates 90, 92, 94 and 96. Again, due to the logic characteristics of these exclusive OR circuits, the logic level on input line 88 determines whether the exclusive OR circuits complement the logic states applied to the input lines 80, 82, 84 and 86. When the input to line 88 is at a high logic level, the outputs of the exclusive OR circuits in integrated circuit 11 are the complements of their inputs, thereby providing the decoding necessary to convert the original internal output of the integrated circuit 10 to the same form for use by the internal inputs of the integrated circuit 11. It is emphasized that the internal and external inputs and outputs referred to herein may all physically be internal to the integrated circuit chip, but are referred to as such to indicate the proximity of the output line in the signal path with respect to the external pins of the integrated circuit.

The operation of the circuit shown in the drawing can be described by indicating logic levels throughout the circuit for five clock periods, with the logic levels representing most of the different conditions which can exist within the circuit. The first set of logic values will be assumed to exist in the circuit at the beginning of the analysis. These are represented by the first vertical column of logic values indicated for the particular region of the circuit. These regions include the logic values 98 at the internal output lines of the integrated circuit 10, or the output lines which contain the logic states which are to be clocked onto the output lines of the integrated circuit 10. Other regions include the complemented region 100, the output region 102, the input region 104, the counter input region 106, the counter output region 108, and the control region 110. The states in the initial or first column in each of these regions are all at logic 0 at the beginning of this analysis.

The second vertical column of region 98 indicates that the next signal or word to be clocked onto the four outputs of the integrated circuit 10 contains three 0's and one 1. These logic values at region 98 are compared with the existing logic values at the output of integrated circuit 10, which are indicated by the first column of output region 102. By the comparative action of exclusive OR gates 52, 54, 56 and 58, the second column of counter input region 106 contains three 0's and one 1, with the single 1 indicating that one of the output lines would change state if the output word is clocked onto the output line unchanged. The counter circuit 60 determines that the one high logic value does not meet the criteria for a high signal at either of its outputs. Consequently, the second column of the counter output region 108 contains zeroes.

Assuming that a high logic level is applied to the inhibit line 76, which is the level needed for the invention to function as an output state reduction circuit, the AND gates 66 and 68 will both provide 0 outputs at this stage of the analysis. Consequently, the output of OR gate 70 is 0 as indicated by the second number in the control region 110. A 0 on this line is transferred across line 36 to the exclusive OR circuits in the output line path, and sets them for providing outputs which are identical to their inputs. Thus, at this stage of the analysis, the output word will not be complemented.

The logic value on the line 36 is also applied to the flip-flop 72 which latches this level onto the output line 78. At the instant of clocking of the data, the uncomplemented data shown by the second column of the complemented region 100, is latched onto the output lines, as shown by the second column in the output region 102. Since the extra output line has the appropriate logic level, the inputs to the integrated circuit 11 are not complemented, as shown by the second column of input region 104, and are the same as the original values.

The next output word to be clocked onto the output lines is represented in the third column of region 98. This word contains two bits which will change state at the output if not complemented. This is represented by the two 1's in the third column of region 106. Since this satisfies one of the conditions of the counter 60, the third column of region 108 includes a 1 on line 64. This would normally cause gate 68 to provide a 1 at its output, however, since the output of flip-flop 72 is zero from the preceding analysis, the output of gate 68 remains at 0. Consequently, the third number of region 110 is 0, resulting in no complementing by the exclusive OR gates 28, 30, 32 and 34. This is indicated by the third column of region 100, the third column of region 102, and the third column of region 104.

The fourth word to be clocked onto the output of the integrated circuit 10 contains two 0's and two 1's, as shown by the fourth column of region 98. This word would require three state changes at the output of the integrated circuit 10 if not complemented. Thus, the fourth column of region 106 includes three 1's and one 0. This satisfies the condition corresponding to line 62 from the counter 60 and produces a 1 at the fourth column of region 108. This produces a 1 at the output of gate 66 and forces the output of gate 70 to 1, as shown by the fourth number of region 110. Since a 1 on line 36 initiates the complementing action, the output indicated by the fourth column of the complementing region 100 is the complement of the input word. Upon clocking, this complemented word is latched onto the output as indicated by the fourth column of region 102, and is inputted to the integrated circuit 12 as shown by the fourth column of input region 104. It should be noted that the fourth column of regions 102 and 104 are complemented since the extra input line 88 is at a logic level of 1 due to the control from the extra output line 78.

The fifth word to be outputted by the integrated circuit 10 is represented by the fifth vertical column in region 98. A comparison of this word with the present word latched at the output, or the fourth column at region 102, indicates that there are two output states which would change if the word is clocked onto the output without complementing. Thus, the fifth column of region 106 includes two 0's and two 1's. This provides the fifth column of region 108 with one 0 and one 1, with the 1 applied to OR gate 68. Since the control output of flip-flop 72 is at 1 from the previous word, the 1 applied to the input of the OR gate 68 from the counter 60 forces the output of the OR gate 68 to 1. The output of OR gate 70 remains 1 as indicated by the fifth number in region 110. Therefore, the fifth output word is complemented as shown by the fifth column of region 100 and the fifth column of region 102, and then complemented back to the original word, as shown by the fifth column of region 104. It should be noted that both the third and fifth sequential words resulted in producing two output state changes at the output of the integrated circuit 10. However, the third word was not complemented and the fifth word was complemented. The reason for the difference is that the fourth word was complemented and, in order to keep from changing the additional output line, the fifth word was complemented also. If not complemented, the fifth word would have produced three state changes when the extra or decoding output line is taken into consideration.

The preferred embodiment of this invention has been described in connection with four output lines and one additional control or decoding line. It is emphasized that the invention may be used with other numbers of output lines, whether they result in an odd or even number of total synchronously clocked parallel output lines. When an odd number of output lines is used, the output from counter 60 applied to line 64 would not be needed since it would not be possible to have that number detected by the counter. The output to the line 62 from the counter 60 would be at a logic 1 when the criteria for an odd number of output lines is met. This criteria would preferably be a counted number which is greater than one-half of one less than the total number of original output lines. In other words, for an odd numbered output line system using a five bit output word which is to be clocked onto five output lines, the line 62 would be forced to a one logic level when the counter exceeds two.

The invention disclosed herein provides a convenient and economical way to reduce the number of state changes at the output of an integrated circuit. This results in decreased power consumption of the device, and permits more flexibility in the design of the transistors and gates on the integrated circuit chip. The circuit used for this purpose increases the number of gates on the integrated circuit and adds at least one additional output line to the device, however, these trade-offs are reasonable with present technology in achieving the reduced power consumption.

Since different embodiments of the invention may be made without departing from the scope of the invention, it is intended that all of the matter contained in the foregoing description, or shown in the accompanying drawing, shall be interpreted as illustrative rather than limiting.

I claim as my invention:

1. A system for reducing the number of state changes in a plurality of synchronously clocked output lines of an integrated circuit, said system comprising:
    means for comparing the present states of the output lines with the next states ready to be clocked onto the output lines;
    means for determining the number of output lines which would change state upon clocking the next states onto the output lines, and for determining when the output line state change number exceeds a first predetermined number; and means for complementing all of the next states before being clocked onto the output lines, and for outputting a first logic state to an additional output line, when the determined number of output lines which would change state exceeds said predetermined number.

2. The system of claim 1 wherein the predetermined number equals one-half the number of output lines for even numbers of output lines.

3. The system of claim 1 wherein the predetermined number equals one-half of one less than the number of output lines for odd numbers of output lines.

4. The system of claim 2 wherein the complementing means also complements said next states and outputs a first logic state to said additional output when the number of output lines which would change state equals said predetermined number and the present output states have been complemented.

5. The system of claim 1 wherein the comparing means provides signals at high logic states for each output line which has a different state than that which is ready to be clocked onto the output line, and wherein the comparing means includes two-input exclusive OR gates each having one input connected to respond to a present output state and the other input connected to respond to the corresponding next state ready to be clocked onto the corresponding output line.

6. The system of claim 1 wherein the complementing means includes exclusive OR gates connected in the output line path, with an input of each gate connected to a common signal derived, at least partially, from said determining means.

7. The system of claim 6 wherein the common signal to which each gate input is connected controls whether the output from the exclusive OR gates is the same or the complement of the logic level applied to the input of the OR gates.

8. The system of claim 1 including means for inhibiting the operation of the complementing means so that the integrated circuit can be used with devices which cannot recognize when the inputs to said devices are complemented.

9. The system of claim 1 wherein the output lines are latched in the appropriate state by D-type flip-flops.

10. The system of claim 1 including means associated with input lines of the integrated circuit for complementing the states of the input lines.

11. The system of claim 10 wherein the states are complemented when an additional input line to the integrated circuit is at said first logic state.

12. The system of claim 11 wherein the input complementing means includes exclusive OR gates having a common input connected to said additional input line.

13. A system for reducing the number of state changes in a plurality of synchronously clocked output lines of an integrated circuit, said system comprising:

first logic gates connected to produce first logic states corresponding to each output line when the present state of said output line is different that the logic state ready to be clocked onto the output line;

a counter circuit for counting the number of said logic gates producing said first logic state prior to clocking the next states onto the output lines;

a logic array for providing a first logic signal when the number of said logic gates counted exceeds a first predetermined number;

second logic gates connected to complement logic states clocked onto the output lines when said logic array provides said first logic signal; and a supplemental line to which a second logic signal is applied only when the output states have been complemented.

14. The system of claim 13 wherein said first predetermined number is equal to one-half the number of synchronously clocked output lines for an even number of output lines.

15. The system of claim 13 wherein said first predetermined number is equal to one-half of one less than the number of synchronously clocked output lines for an odd number of output lines.

16. The system of claim 13 wherein said second logic gates complement the logic states also in response to a third logic signal, said third logic signal being provided by the logic array when the number of logic gates counted equals said first predetermined number and the present output states have been complemented.

17. The system of claim 13 including a logic gate for inhibiting the first logic signal from the logic array when an input to the gate is held in one of its two states.

18. A system for reducing the number of state changes in a plurality of synchronously clocked output lines of an integrated circuit, said system comprising:

means for comparing the present states of the output lines with the next states ready to be clocked onto the output lines;

means for determining the number of output lines which would change state upon clocking the next states onto the output lines, and for determining when the output line state change number exceeds a first predetermined number; and means for complementing all of the next states before being clocked onto the output lines, and for outputting a first logic state to an additional output line, when the determined number of output lines which would change state exceeds said predetermined number;

said comparing means providing signals at high logic states for each output line which has a different state than that which is ready to be clocked onto the output line; and said comparing means having two-input exclusive OR gates each with one input connected to respond to a present output state and the other input connected to respond to the corresponding next state ready to be clocked onto the corresponding output line.

* * * * *